United States Patent
Chen

(10) Patent No.: US 9,987,712 B2
(45) Date of Patent: Jun. 5, 2018

(54) MANUFACTURING METHOD OF FLAT-PLATE HEAT PIPE

(71) Applicant: ASIA VITAL COMPONENTS CO., LTD., New Taipei (TW)

(72) Inventor: Chih-Ming Chen, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 203 days.

(21) Appl. No.: 14/676,826

(22) Filed: Apr. 2, 2015

(65) Prior Publication Data

US 2016/0288276 A1    Oct. 6, 2016

(51) Int. Cl.
*F28D 15/00*    (2006.01)
*B23P 15/26*    (2006.01)
*F28D 15/02*    (2006.01)
*F28D 15/04*    (2006.01)
*H01L 23/427*    (2006.01)

(52) U.S. Cl.
CPC .......... *B23P 15/26* (2013.01); *F28D 15/0283* (2013.01); *F28D 15/04* (2013.01); *H01L 23/427* (2013.01); *B23P 2700/09* (2013.01); *F28F 2275/06* (2013.01)

(58) Field of Classification Search
CPC ...... B23P 15/26; B23P 2700/09; F28D 15/04; F28D 15/0283; H01L 23/427; F28F 2275/06
See application file for complete search history.

(56) References Cited

U.S. PATENT DOCUMENTS

| | | | |
|---|---|---|---|
| 7,770,630 B2 * | 8/2010 | Chesser | F28D 15/043 165/104.13 |
| 8,047,269 B2 * | 11/2011 | Kang | F28D 15/0233 165/104.26 |
| 8,403,032 B2 * | 3/2013 | Huang | F28D 15/0233 165/104.26 |
| 2006/0096740 A1 * | 5/2006 | Zheng | F28D 15/0233 165/104.26 |

* cited by examiner

*Primary Examiner* — Richard Chang
(74) *Attorney, Agent, or Firm* — Jackson IPG PLLC; Demian K. Jackson

(57) ABSTRACT

A manufacturing method of flat-plate heat pipe includes steps of: providing a first board body, a second board body and a capillary structure; selectively affixing the capillary structure to the first board body or the second board body; overlapping and mating the first and second board bodies with each other and sealing the open peripheries of the first and second board bodies to form a flat tubular main body with a reserved air-sucking and water-filling section; and vacuuming the flat tubular main body and filling working fluid into the flat tubular main body and sealing the air-sucking and water-filling section. By means of the manufacturing method of the flat-plate heat pipe, the flat-plate heat pipe can be formed with a thin thickness. After the flat-plate heat pipe is thinned, the flat-plate heat pipe still has a complete vapor passage.

5 Claims, 5 Drawing Sheets

MANUFACTURING METHOD OF FLAT-PLATE HEAT PIPE

BACKGROUND OF THE INVENTION

1. Field of the Invention

The present invention relates generally to a manufacturing method of flat-plate heat pipe. By means of the manufacturing method of the flat-plate heat pipe, the flat-plate heat pipe can be formed with a thin thickness. Moreover, after the flat-plate heat pipe is thinned, the flat-plate heat pipe still has a free vapor passage.

2. Description of the Related Art

Currently, there is a trend to develop lightweight and thin electronic mobile devices. The lightweight and thin electronic mobile devices have higher and higher operation performance. However, along with the promotion of the operation performance and the reduction of the total thickness of the electronic mobile device, the internal space of the electronic mobile device for receiving electronic components is minified and limited. Moreover, when the operation performance is enhanced, the heat generated by the electronic components is increased. Therefore, a heat dissipation component is needed to help in dissipating the heat generated by the electronic components. However, due to the thinning of the electronic mobile device, the internal space of the electronic mobile device is so narrow that it is hard to arrange a heat dissipation component such as a cooling fan in the electronic mobile device. Under such circumstance, only a copper thin sheet or an aluminum thin sheet can be disposed to enlarge the heat dissipation area. However, this can hardly sufficiently enhance the heat dissipation efficiency.

In the conventional technique, a heat pipe or vapor chamber can be thinned and applied to the electronic mobile device. However, it is hard to fill powder into the thin heat pipe and sinter the powder. As a result, an extremely thin electronic mobile device can be hardly achieved. Also, after the powder is filled and sintered and when the heat pipe is flattened into a flat structure, the sintered powder or other capillary structure (mesh body or fiber body) in the heat pipe will be compressed and damaged to lose its function.

In addition, in order to more thin the conventional vapor chamber, the internal support structure is often omitted. In this case, after the vapor chamber is vacuumed and sealed, the internal chamber of the vapor chamber is likely to deform. As a result, the internal vapor passage of the conventional thin heat pipe or vapor chamber will be contracted and minified or even disappear. This will affect the vapor-liquid circulation efficiency of the heat pipe or vapor chamber. Therefore, it has become a critical issue how to improve the internal vapor-liquid circulation structure of the thin heat pipe and vapor chamber.

SUMMARY OF THE INVENTION

It is therefore a primary object of the present invention to provide a manufacturing method of flat-plate heat pipe. By means of the manufacturing method of the flat-plate heat pipe, the flat-plate heat pipe can be formed with a thin thickness. Moreover, after the flat-plate heat pipe is thinned, the flat-plate heat pipe still has a complete vapor passage.

To achieve the above and other objects, the manufacturing method of flat-plate heat pipe of the present invention includes steps of: providing a first board body, a second board body and a capillary structure; selectively affixing the capillary structure to the first board body or the second board body; overlapping and mating the first and second board bodies with each other and sealing the open peripheries of the first and second board bodies to form a flat tubular main body with a reserved air-sucking and water-filling section; and vacuuming the flat tubular main body and filling working fluid into the flat tubular main body and sealing the air-sucking and water-filling section.

By means of the manufacturing method of the flat-plate heat pipe, after the flat-plate heat pipe is thinned, the flat-plate heat pipe still has a complete vapor passage. Therefore, the vapor-liquid circulation of the working fluid in the internal chamber of the thinned flat-plate heat pipe can be still successfully performed.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
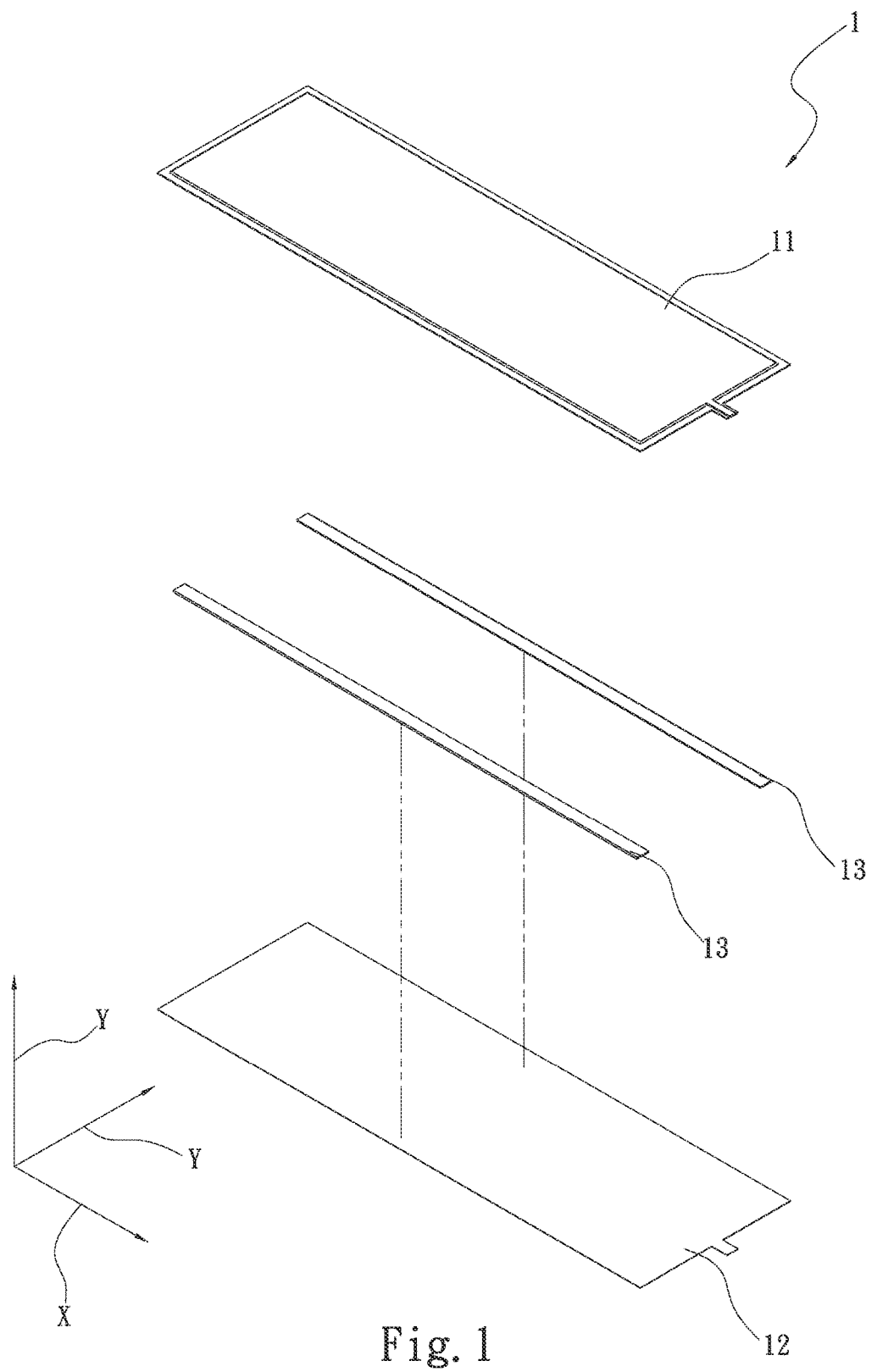
FIG. 1 is a perspective exploded view of a first embodiment of the flat-plate heat pipe of the present invention.
Figure 2:
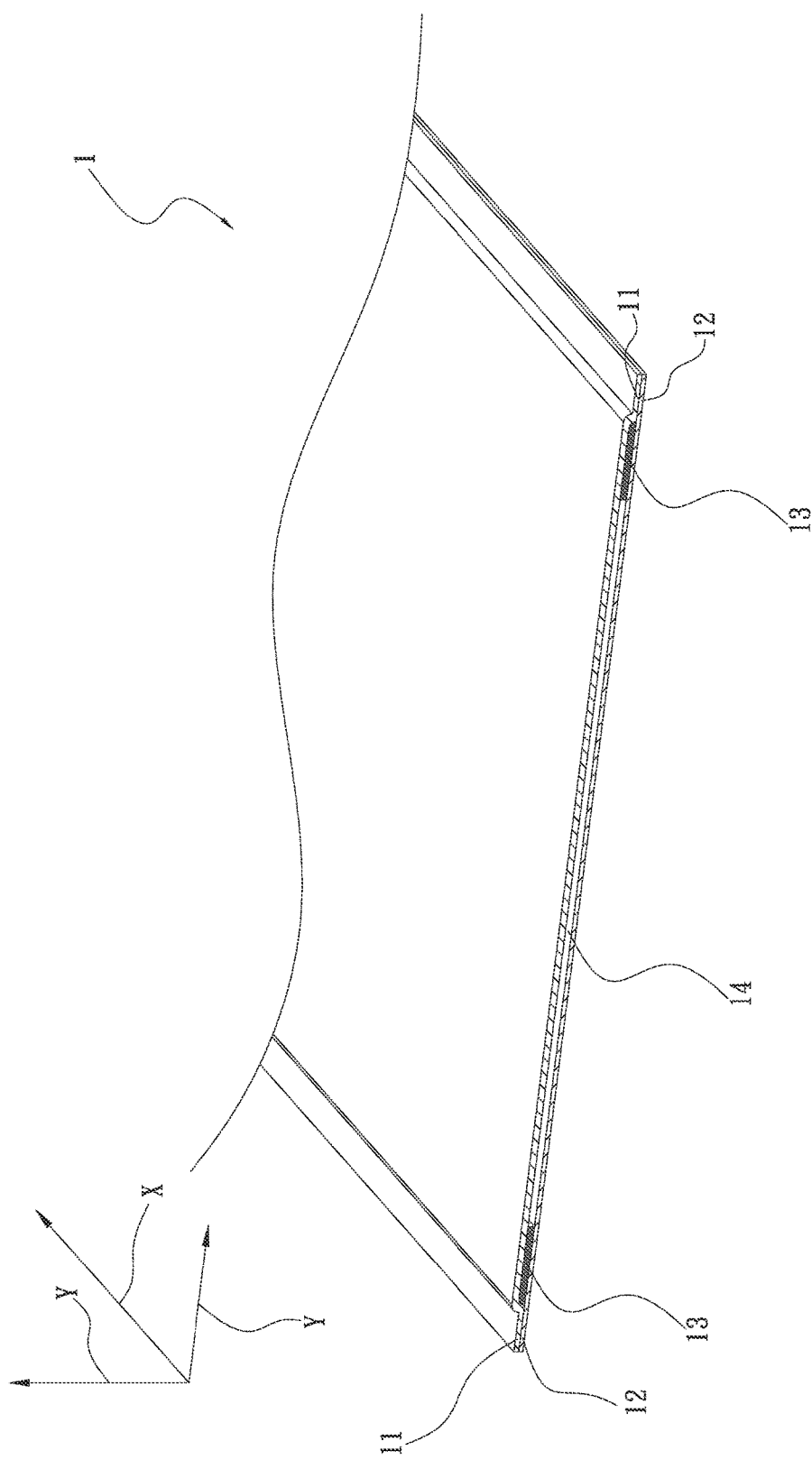
FIG. 2 is a sectional assembled view of the first embodiment of the flat-plate heat pipe of the present invention.

Please refer to FIGS. 1 and 2. FIG. 1 is a perspective exploded view of a first embodiment of the flat-plate heat pipe of the present invention. FIG. 2 is a sectional assembled view of the first embodiment of the flat-plate heat pipe of the present invention. According to the first embodiment, the flat-plate heat pipe of the present invention includes a flat tubular main body 1.

Figure 3:
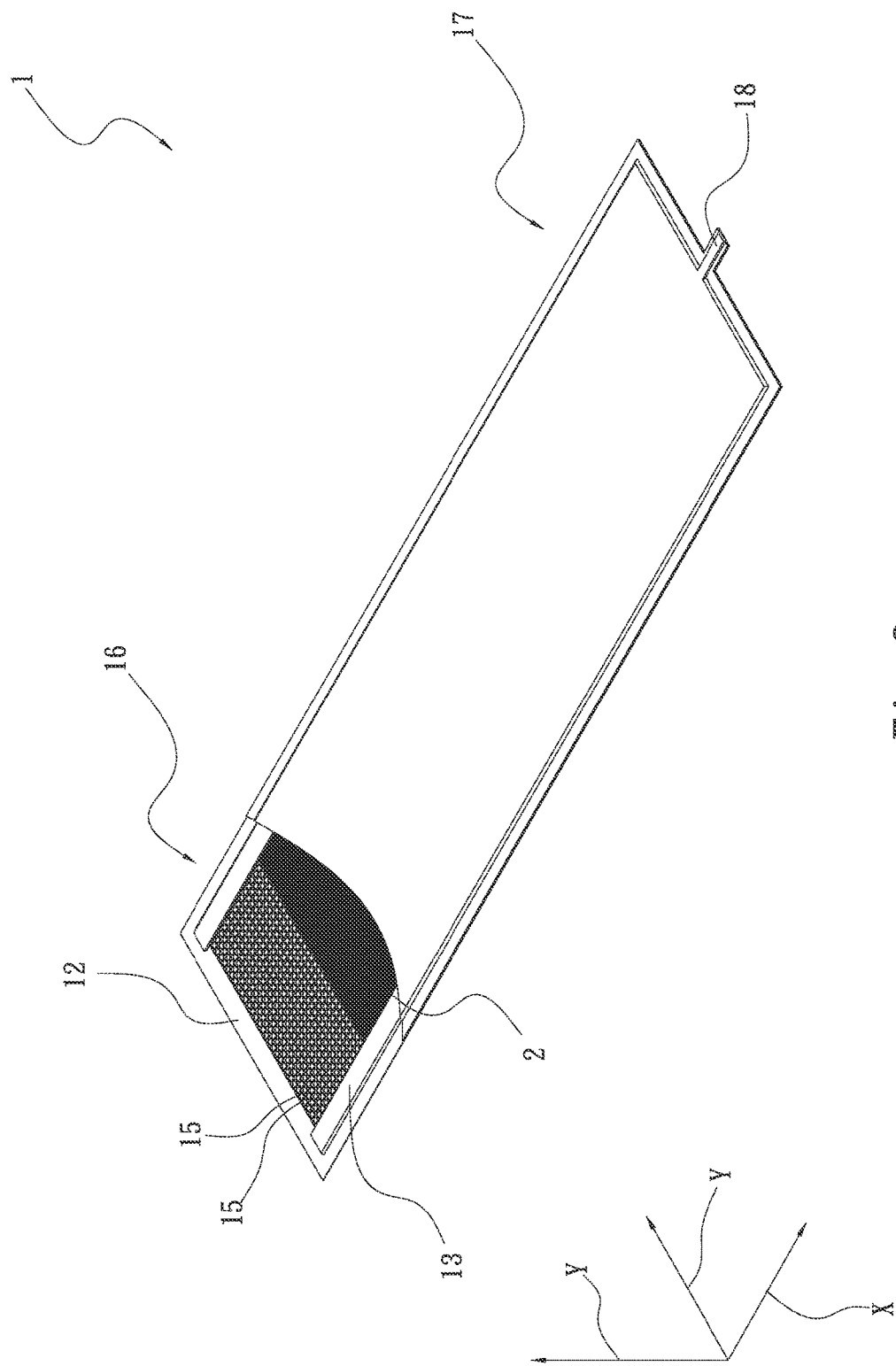
FIG. 3 is a sectional assembled view of a second embodiment of the flat-plate heat pipe of the present invention.

The flat tubular main body 1 has a first board body 11, a second board body 12, at least one capillary structure 13 and a working fluid 2 (as shown in FIG. 3). The first and second board bodies 11, 12 are overlapped and mated with each other. The capillary structure 13 is disposed between the first and second board bodies 11, 12. The capillary structure 13 and the first and second board bodies 11, 12 together define at least one vapor passage 14.

The capillary structure 13 is selected from a group consisting of mesh body, fiber body, powder sintered body, linear braided body and sintered powder body. In this embodiment, the first capillary structure 13 is, but not limited to, sintered powder body for illustration purposes only. The thickness of the first and second board bodies ranges from 0.01 mm to 0.15 mm.

In this embodiment, there is a pair of capillary structures 13 and the vapor passage 14 is formed between the two capillary structures 13.

The flat tubular main body 1 further has an air-sucking and water-filling section 18.

Please now refer to FIG. 3, which is a sectional assembled view of a second embodiment of the flat-plate heat pipe of the present invention. The second embodiment is partially identical to the first embodiment in structure and technical characteristic and thus will not be repeatedly described hereinafter. The second embodiment is different from the first embodiment in that the flat tubular main body 1 further has multiple channels 15, a heat absorption section 16 and a heat dissipation section 17. The multiple channels 15 are disposed in the heat absorption section 16. The channels 15 transversely and longitudinally intersect each other. The channels 15 are disposed on one side of the second board body 12 in adjacency to the first capillary structure 13. The channels 15 transversely and longitudinally intersect each other so that the liquid working fluid 2 can also go back to the heat absorption section 16 in a radial direction Y of the flat tubular main body 1.

Figure 4:
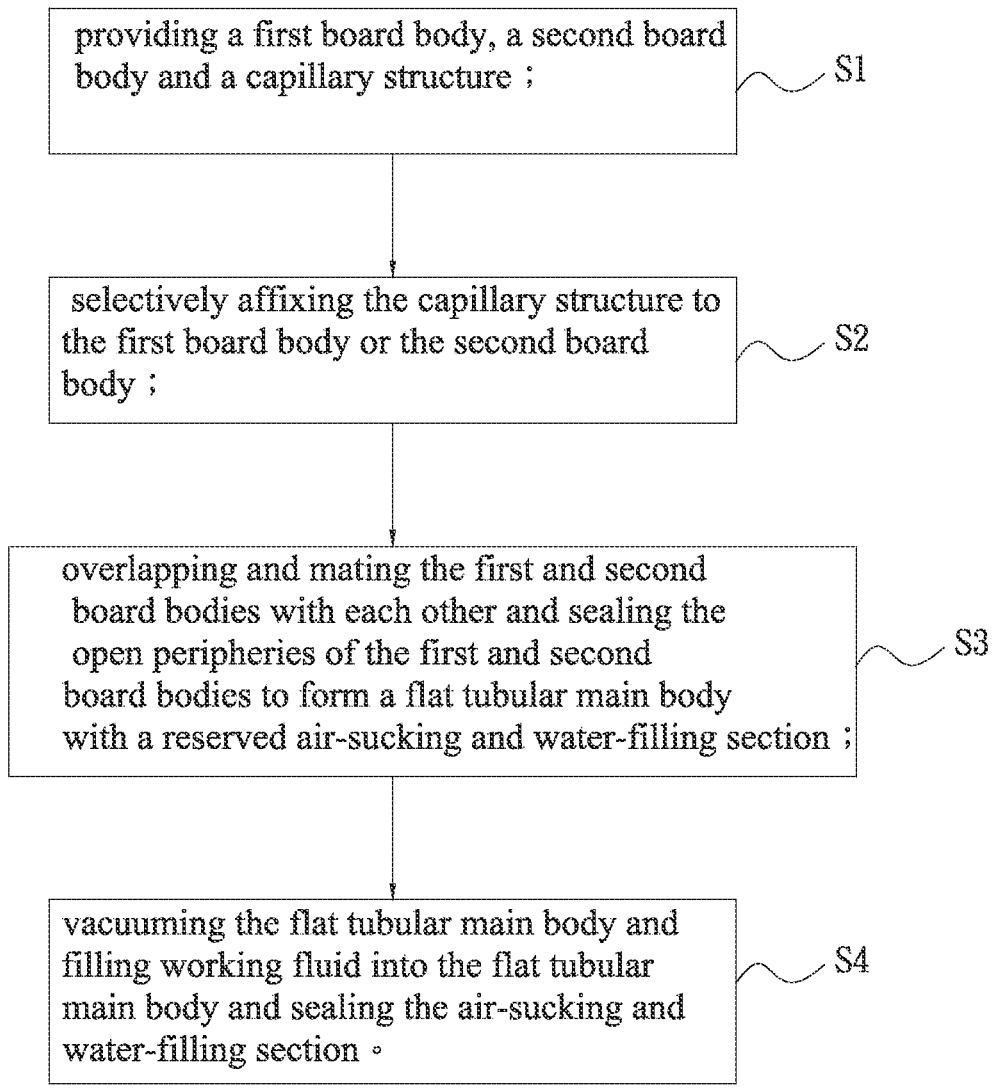
FIG. 4 is a flow chart of a first embodiment of the manufacturing method of flat-plate heat pipe of the present invention.

Please now refer to FIG. 4, which is a flow chart of a first embodiment of the manufacturing method of flat-plate heat pipe of the present invention. Also referring to FIGS. 1 to 3, the manufacturing method of flat-plate heat pipe of the present invention includes steps of:

S1. providing a first board body, a second board body and a capillary structure, a first board body 11, a second board body 12 and at least one capillary structure 13 serving as a water-sucking wick and support structure being provided, the first and second board bodies 11, 12 being made of copper material, the thickness of the first and second board bodies 11, 12 ranging from 0.01 mm to 0.15 mm, the capillary structure 13 being selected from a group consisting of sintered powder body, mesh body, fiber body and a combination of sintered powder body, mesh body and fiber body;

S2. selectively affixing the capillary structure to the first board body or the second board body, the capillary structure 13 serving as a water-sucking wick and support structure being disposed on the first and second board bodies 11, 12 by means of diffusion bonding, ultrasonic welding or spot welding;

S3. overlapping and mating the first and second board bodies with each other and sealing the open peripheries of the first and second board bodies to form a flat tubular main body with a reserved air-sucking and water-filling section, the first and second board bodies 11, 12 being overlapped and mated with each other, the open peripheries of the first and second board bodies 11, 12 being then sealed by means of diffusion bonding, ultrasonic welding or spot welding to form a flat tubular main body 1 having an internal vapor passage 14 and a reserved air-sucking and water-filling section for vacuuming the interior of the flat tubular main body 1 and filling the working fluid 2 into the flat tubular main body 1; and S4. vacuuming the flat tubular main body and filling working fluid into the flat tubular main body and sealing the air-sucking and water-filling section, the flat tubular main body being vacuumed and filled with the working fluid 2 through the reserved air-sucking and water-filling section and then the reserved air-sucking and water-filling section being sealed.

Figure 5:
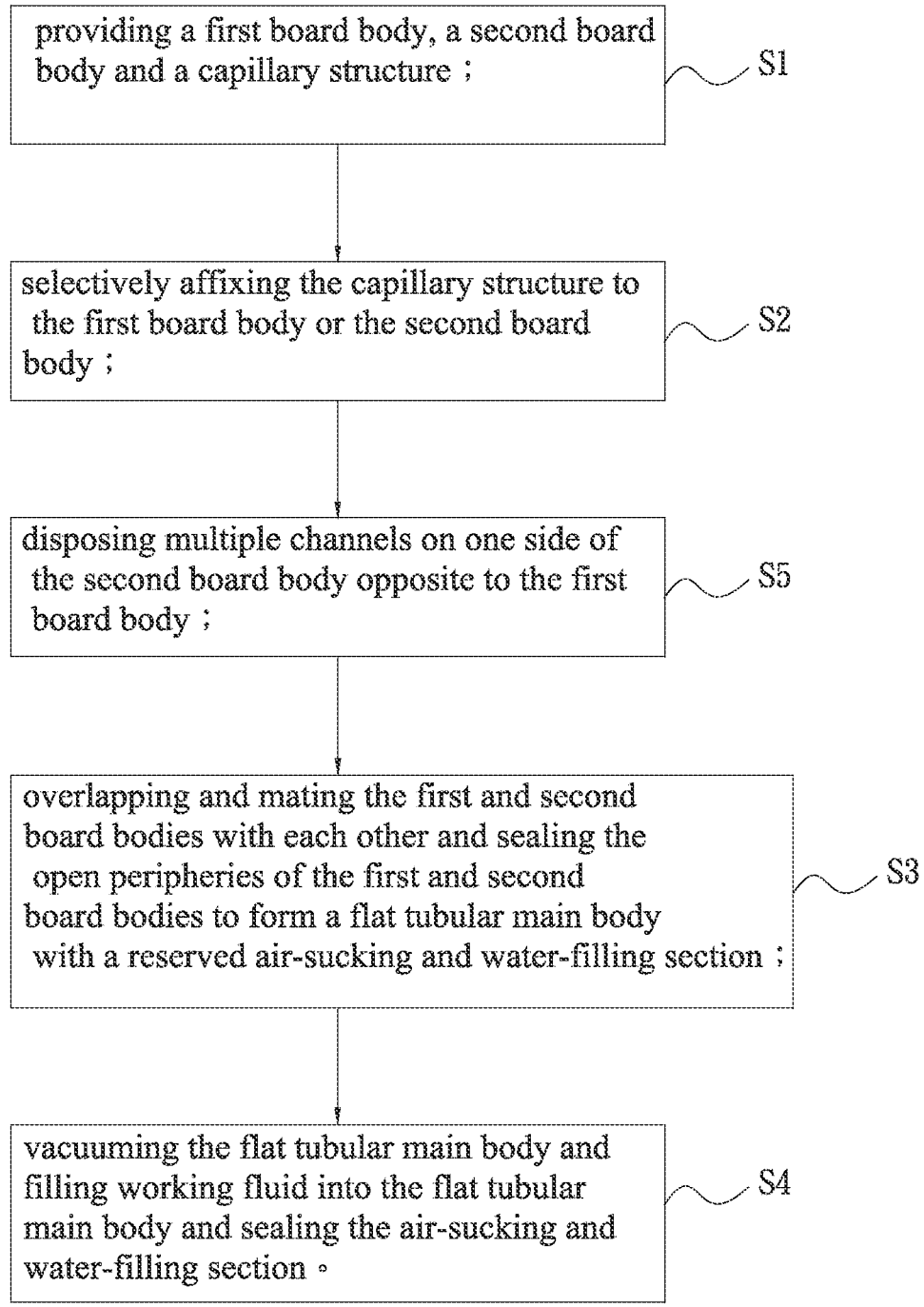
FIG. 5 is a flow chart of a second embodiment of the manufacturing method of flat-plate heat pipe of the present invention.

Please now refer to FIG. 5, which is a flow chart of a second embodiment of the manufacturing method of flat-plate heat pipe of the present invention. Also referring to FIGS. 1 to 3, the second embodiment is partially identical to the first embodiment in step and thus will not be repeatedly described hereinafter. The second embodiment is different from the first embodiment in that the manufacturing method of flat-plate heat pipe of the present invention further includes a step S5 of disposing multiple channels on one side of the second board body opposite to the first board body after the step S2 of selectively affixing the capillary structure to the first board body or the second board body.

Multiple channels 15 are disposed on one side of the second board body opposite to the first board body. The channels 15 transversely and longitudinally intersect each other. The channels 15 are formed by means of etching, mechanical processing or discharging processing.

The present invention has been described with the above embodiments thereof and it is understood that many changes and modifications in the above embodiments can be carried out without departing from the scope and the spirit of the invention that is intended to be limited only by the appended claims.

What is claimed is:

1. A manufacturing method of flat-plate heat pipe, comprising steps of:
    providing a first board body, a second board body, and a pair of opposed, elongate capillary structures;
    affixing the pair of capillary structures between the first board body and the second board body such that each capillary structure extends along a corresponding one of two opposed long side edges of the first and second board bodies and provides a working fluid sucking wick and support structure;
    overlapping and mating the first and second board bodies with each other and sealing open peripheries of the first and second board bodies to form a flat tubular main body with a reserved air-sucking and working fluid filling section, wherein the capillary structures and the first and second board bodies together define a medially arranged vapor passage where each capillary structure is disposed at one of two opposed long side edges of the medially arranged vapor passage wherein top surfaces of the pair of capillary structures are touching an inside surface of the first board body and bottom surfaces of the pair of capillary structures are touching an inside surface of the second board body;
    forming and disposing multiple channels on one side of the second board body opposite to the first board body by means of mechanical processing to form a heat absorption section arranged at only one end of the flat-plate heat pipe and between and adjacent inner long edges of each capillary structure and wherein the channels are only positioned on the heat absorption section and transversely and longitudinally intersect each other so that liquid working fluid can also go back to the heat absorption section in a radial direction Y; and
    vacuuming the flat tubular main body and filling working fluid into the flat tubular main body and sealing the air-sucking and working fluid filling section.

2. The manufacturing method of flat-plate heat pipe as claimed in claim 1, wherein the first and second board bodies are made of copper material.

3. The manufacturing method of flat-plate heat pipe as claimed in claim 1, wherein the capillary structure is selected from a group consisting of sintered powder body, mesh body, linear braided body, fiber body and a combination thereof.

4. The manufacturing method of flat-plate heat pipe as claimed in claim 1, wherein the open peripheries of the first and second board bodies are sealed by means of diffusion bonding, ultrasonic welding or spot welding.

5. The manufacturing method of flat-plate heat pipe as claimed in claim 1, wherein the capillary structure is selectively affixed to the first board body or the second board body by means of diffusion bonding, ultrasonic welding or spot welding.

\* \* \* \* \*